(12) United States Patent
Kamath et al.

(10) Patent No.: US 10,290,330 B1
(45) Date of Patent: May 14, 2019

(54) PROGRAMMABLE TEMPERATURE COEFFICIENT ANALOG SECOND-ORDER CURVATURE COMPENSATED VOLTAGE REFERENCE

(71) Applicant: Xilinx, Inc., San Jose, CA (US)

(72) Inventors: Umanath R. Kamath, Citywest (IE); John K. Jennings, Glenageary (IE); Edward Cullen, Naas (IE); Ionut C. Cical, Saggart (IE); Darragh Walsh, Leap (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/832,515

(22) Filed: Dec. 5, 2017

(51) Int. Cl.
*G11C 5/14* (2006.01)
*G05F 3/24* (2006.01)
*G01K 7/01* (2006.01)

(52) U.S. Cl.
CPC ............... *G11C 5/147* (2013.01); *G01K 7/01* (2013.01); *G05F 3/242* (2013.01)

(58) Field of Classification Search
CPC ............ G11C 5/147; G01K 7/01; G05F 3/242
USPC .......................................................... 327/350
See application file for complete search history.

(56) References Cited

U.S. PATENT DOCUMENTS

| | | | |
|---|---|---|---|
| 5,666,046 A * | 9/1997 | Mietus | G05F 3/267 323/313 |
| 5,831,845 A | 11/1998 | Zhou et al. | |
| 6,265,857 B1 | 7/2001 | Demsky et al. | |
| 6,559,715 B1 | 5/2003 | Frake et al. | |
| 6,815,998 B1 | 11/2004 | Samad | |
| 7,078,958 B2 * | 7/2006 | Gower | G05F 3/30 323/313 |
| 7,225,099 B1 | 5/2007 | O'Dwyer | |
| 7,495,505 B2 * | 2/2009 | Chang | G05F 3/30 323/313 |
| 7,511,567 B2 * | 3/2009 | Yeo | G05F 3/30 327/539 |

(Continued)

FOREIGN PATENT DOCUMENTS

| | | |
|---|---|---|
| CN | 101178610 | 5/2008 |
| CN | 102880220 | 1/2013 |

*Primary Examiner* — Ryan Jager
(74) *Attorney, Agent, or Firm* — Robert M. Brush

(57) ABSTRACT

An example voltage reference circuit includes: a reference circuit comprising a first circuit configured to generate a proportional-to-temperature current and corresponding first control voltage and a second circuit configured to generate a complementary-to-temperature current and corresponding second control voltage; a first current source coupled to a first load circuit, the first current source generating a sum current of the proportional-to-temperature current and the complementary-to-temperature current in response to the first and second control voltages, the first load circuit generating a zero temperature coefficient (Tempco) voltage from the sum current; and a second current source coupled to a second load circuit, the second current source generating the sum current of the proportional-to-temperature current and the complementary-to-temperature current in response to the first and second control voltages, the second load circuit generating a negative Tempco voltage from the sum current and the complementary-to-temperature current.

20 Claims, 11 Drawing Sheets

(56) References Cited

U.S. PATENT DOCUMENTS

| | | | |
|---|---|---|---|
| 7,570,107 B2 * | 8/2009 | Kim | G05F 3/30 |
| | | | 323/313 |
| 7,859,918 B1 | 12/2010 | Nguyen et al. | |
| 7,965,129 B1 * | 6/2011 | Wadhwa | G05F 1/463 |
| | | | 327/513 |
| 8,283,974 B2 * | 10/2012 | Chu | G05F 3/30 |
| | | | 327/539 |
| 9,525,424 B2 * | 12/2016 | Tung | H03L 1/022 |
| 9,665,116 B1 * | 5/2017 | Arnold | G05F 3/16 |
| 2006/0111865 A1 | 5/2006 | Choi | |
| 2006/0262827 A1 | 11/2006 | Hsu | |
| 2010/0301832 A1 | 12/2010 | Katyal et al. | |
| 2016/0246317 A1 | 8/2016 | Song et al. | |
| 2017/0269627 A1 * | 9/2017 | Cook | G05F 3/267 |

\* cited by examiner

PROGRAMMABLE TEMPERATURE COEFFICIENT ANALOG SECOND-ORDER CURVATURE COMPENSATED VOLTAGE REFERENCE

TECHNICAL FIELD

Examples of the present disclosure generally relate to electronic circuits and, in particular, to a programmable temperature coefficient analog second-order curvature compensated voltage reference.

BACKGROUND

Precision voltage references are important blocks in integrated circuits (ICs), such as System-on-Chip (SoC) ICs. Voltage references are required for various purposes, such as for analog-to-digital converters (ADCs), power management, and the like. Generation of a voltage that is dependent on temperature is also useful in some applications, such as to compensate for temperature effects on circuits. Thus, different circuits in an IC require voltage references having different temperature coefficients (e.g., an ADC uses a temperature-independent voltage reference whereas other circuits, such as switches, require a temperature-dependent voltage reference). Further, circuits for generating voltage references typically use bipolar junction transistors (BJTs). BJTs, however, are parasitic devices in the complementary metal oxide semiconductor (CMOS) process used to fabricate ICs. BJT performance degrades as the CMOS technology scales, which is driven by digital logic. Accordingly, it is desirable to provide a voltage reference circuit that can generate flexible temperature coefficient voltages while compensating for second-order curvature introduced by BJTs.

SUMMARY

Techniques for providing a programmable temperature coefficient analog second-order curvature compensated voltage reference are described. In an example, a voltage reference circuit includes: a reference circuit comprising a first circuit configured to generate a proportional-to-temperature current and corresponding first control voltage and a second circuit configured to generate a complementary-to-temperature current and corresponding second control voltage; a first current source coupled to a first load circuit, the first current source generating a sum current of the proportional-to-temperature current and the complementary-to-temperature current in response to the first and second control voltages, the first load circuit generating a zero temperature coefficient (Tempco) voltage from the sum current; and a second current source coupled to a second load circuit, the second current source generating the sum current of the proportional-to-temperature current and the complementary-to-temperature current in response to the first and second control voltages, the second load circuit generating a negative Tempco voltage from the sum current and the complementary-to-temperature current.

In an example, an integrated circuit includes: one or more circuits; and a voltage reference circuit that supplies at least one voltage to the one or more circuits. The voltage reference circuit includes: a reference circuit comprising a first circuit configured to generate a proportional-to-temperature current and corresponding first control voltage and a second circuit configured to generate a complementary-to-temperature current and corresponding second control voltage; a first current source coupled to a first load circuit, the first current source generating a sum current of the proportional-to-temperature current and the complementary-to-temperature current in response to the first and second control voltages, the first load circuit generating a zero temperature coefficient (Tempco) voltage from the sum current; and a second current source coupled to a second load circuit, the second current source generating the sum current of the proportional-to-temperature current and the complementary-to-temperature current in response to the first and second control voltages, the second load circuit generating a negative Tempco voltage from the sum current and the complementary-to-temperature current.

In another example, a method of generating a voltage reference includes: generating a proportional-to-temperature current and corresponding first control voltage in a first circuit of a reference circuit; generating a complementary-to-temperature current and corresponding second control voltage in a second circuit of the reference circuit; generating a sum current of the proportional-to-temperature current and the complementary-to-temperature current in a first current source in response to the first and second control voltages; generating a zero temperature coefficient (Tempco) voltage from the sum current in a first load circuit coupled to the first current source; generating the sum current of the proportional-to-temperature current and the complementary-to-temperature current in a second current source in response to the first and second control voltages; and generating a negative Tempco voltage from the sum current and the complementary-to-temperature current in a second load circuit coupled to the second current source.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
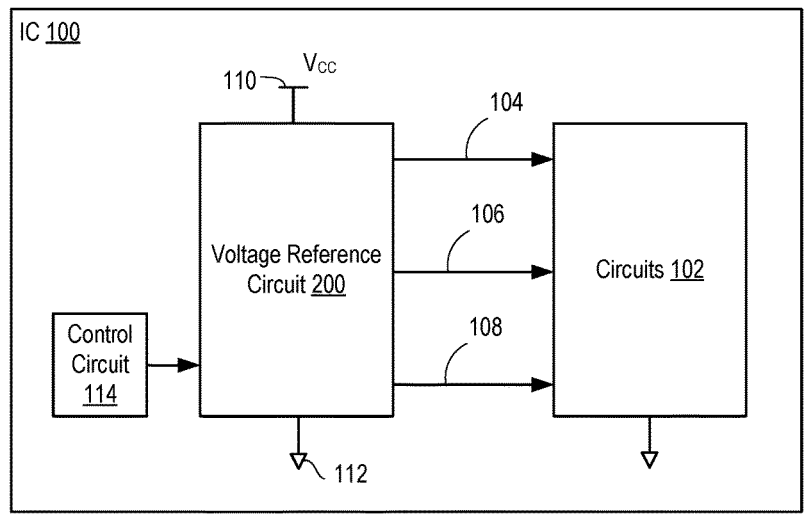
FIG. 1 is a block diagram depicting an integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting an integrated circuit (IC) 100 according to an example. The IC 100 includes a voltage reference circuit 200, a control circuit 114, and circuits 102. The voltage reference circuit 200 is coupled between a supply node 110, which supplies a voltage $V_{CC}$, and a ground node 112, which supplies a ground voltage (e.g., 0 volts). The voltage $V_{CC}$ may be provided by a voltage supply (not shown) either within the IC 100 or external to the IC 100. The voltage reference circuit 200 is coupled to one or more of the circuits 102 by one or more nodes 104, each of which supplies a zero temperature coefficient (Tempco) voltage. The voltage reference circuit 200 is coupled to one or more of the circuits 102 by one or more nodes 106, each of which supplies a negative Tempco voltage. The voltage reference circuit 200 is coupled to one or more of the circuits 102 by one or more nodes 108, each of which supplies a positive Tempco voltage. Thus, the voltage reference circuit 200 generates zero Tempco voltage(s), negative Tempco voltage(s), and positive Tempco voltage(s). The control circuit 114 supplies control signals to the voltage reference circuit 200 for trimming voltages and/or currents as described in detail below.

Figure 2:
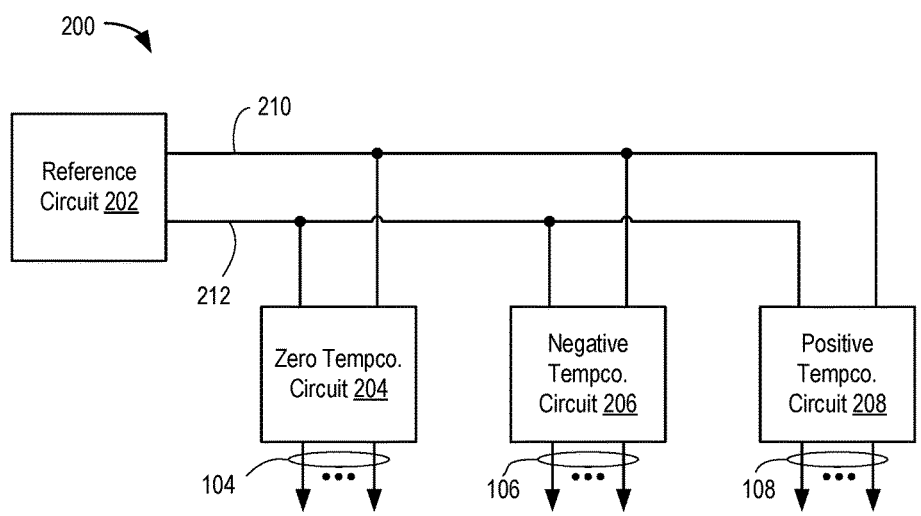
FIG. 2 is a block diagram depicting a voltage reference circuit according to an example.

FIG. 2 is a block diagram depicting the voltage reference circuit 200 according to an example. The voltage reference circuit 200 includes a reference circuit 202, a zero Tempco circuit 204, a negative Tempco circuit 206, and a positive Tempco circuit 208. A node 210 couples one output of the reference circuit 202 to each of the Tempco circuits 204 . . . 208. A node 212 couples another output of the reference circuit 202 to each of the Tempco circuits 204 . . . 208. The nodes 210 and 212 supply control voltages to the Tempco circuits 204 . . . 208. The reference circuit 202 generates a proportional-to-temperature current (referred to as Iptat) and a complementary-to-temperature current (referred to as Ictat), as described further below. The control voltages on the nodes 210 and 212 control current sources in the Tempco circuits 204 . . . 208 to mirror the currents Iptat and Ictat, respectively. The zero Tempco circuit 204 converts a zero Tempco current Iztat (Iztat=Iptat+Ictat) into one or more zero Tempco voltages at the nodes 104. The negative Tempco circuit 206 converts the current Iztat into one or more negative Tempco voltages at the nodes 106. The positive Tempco circuit 208 converts the current Iztat into one or more positive Tempco voltages at the nodes 108.

Figure 3:
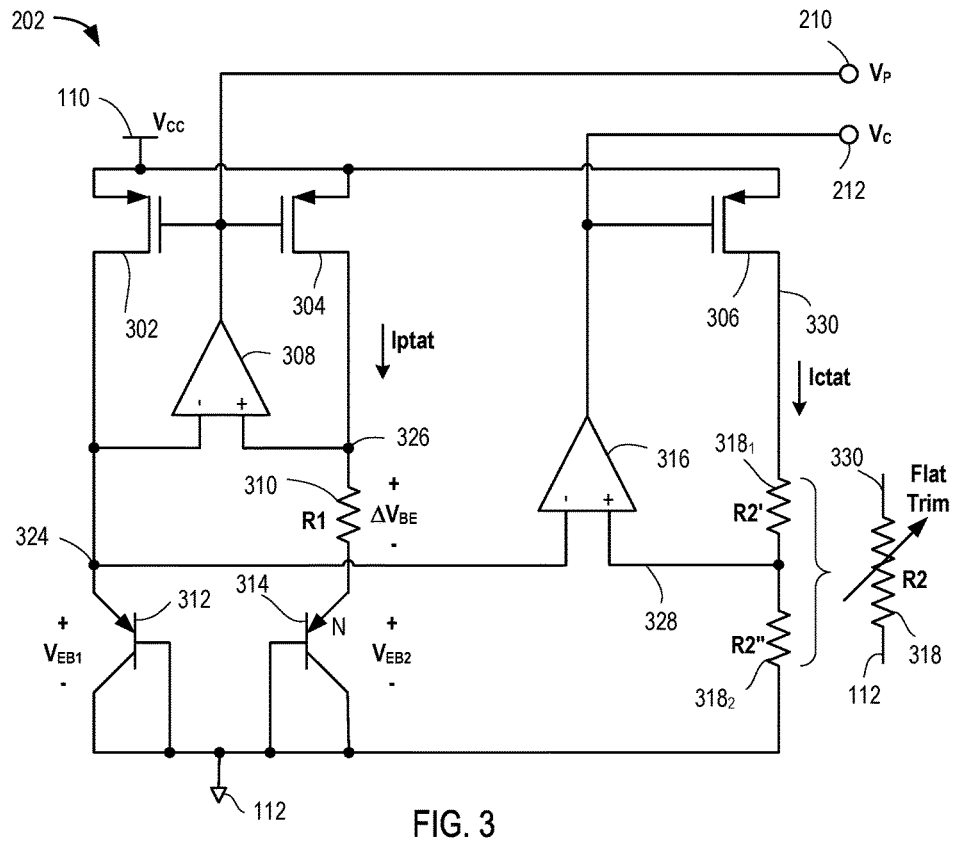
FIG. 3 is a schematic diagram depicting a reference circuit according to an example.

FIG. 3 is a schematic diagram depicting the reference circuit 202 according to an example. The reference circuit 202 includes p-channel field effect transistors (FETs) 302, 304, and 306, such as p-type metal oxide semiconductor FETs (MOSFETs). A p-channel FET is a FET that uses holes as the majority carrier to carry its channel current. The reference circuit 202 further includes an operational amplifier 308, an operational amplifier 316, a multiplexer 320, a resistor 310, a resistor ladder 318, a bipolar junction transistor (BJT) 312, and a BJT 314. The BJTs 312 and 314 are PNP transistors.

A source of the FET 302 is coupled to the node 110 that supplies $V_{CC}$. A drain of the FET 302 is coupled to a node 324. A gate of the FET 302 is coupled to the node 210 that supplies a control voltage $V_P$. A source of the FET 304 is coupled to the node 110. A drain of the FET 304 is coupled to a node 326. A gate of the FET 304 is coupled to the node 210. A source of the FET 306 is coupled to the node 110. A gate of the FET 306 is coupled to the node 212 that supplies a control voltage $V_C$. A drain of the FET 306 is coupled to a node 330. The resistor ladder 318, having a total resistance R2, is coupled between the node 330 and the ground node 112.

Figure 4:
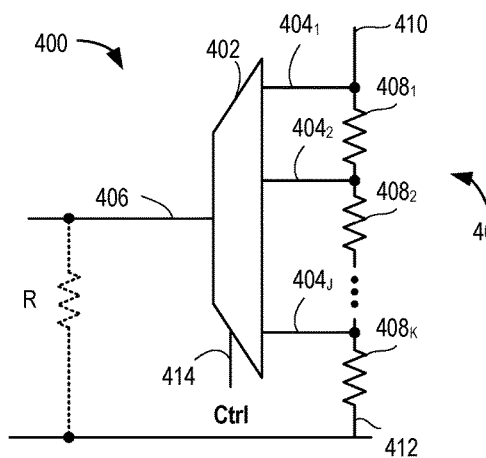
FIG. 4 is a schematic diagram depicting a resistor ladder according to example.

FIG. 4 is a schematic diagram depicting a resistor ladder 400 according to example. The resistor ladder 400 can be used as the resistor ladder 318 or any other resistor ladder described herein. The resistor ladder 400 includes a resistor string 408, e.g., resistors $408_1$ . . . $408_K$, where K is an integer greater than one. The resistors $408_1$ . . . $408_K$ are coupled in series between a node 410 and a node 412. The resistor ladder 400 further includes a multiplexer 402. Inputs of the multiplexer 402 are respectively coupled to a plurality of taps, e.g., taps $404_1$ . . . $404_J$, where J is an integer greater than one. Each tap $404_1$ . . . $404_J$ is coupled to a respective node of the resistor string 408, where the resistor string 408 includes one or more resistors between each pair of nodes. The multiplexer 402 includes a control input 414 for receiving a signal Ctrl that selects one of the taps 404. The signal Ctrl is a digital signal having ceiling[$\log_2(J)$] bits. The multiplexer 402 includes an output coupled to a node 406. The resistor ladder 400 provides an effective resistance R between the node 406 and the node 412 (shown in phantom for purposes of illustration), which depends on the code value of the Ctrl signal.

Returning to FIG. 3, a node 328 is coupled to a selected tap of the resistor ladder 318 based on the value of a Flat Trim code. This effectively splits the resistor ladder 318 into a resistance $318_1$ between the node 330 and the node 328, and a resistance $318_2$ between the node 328 and the ground node 112. The resistance $318_1$ has a value R2', and the resistance $318_2$ has a value R2".

An inverting input of the operational amplifier 308 is coupled to the node 324. A non-inverting input of the operational amplifier 308 is coupled to the node 326. An output of the operational amplifier 308 is coupled to the node 210. An inverting input of the operational amplifier 316 is coupled to the node 324. A non-inverting input of the operational amplifier 316 is coupled to a node 328. An output of the operational amplifier 316 is coupled to the node 212.

The resistor 310, having a resistance R1, is coupled between the node 326 and an emitter of the BJT 314. Each of a base and a collector of the BJT 314 is coupled to the ground node 112. Thus, the BJT 314 is a diode-connected BJT having an anode coupled to the resistor 310 and a cathode coupled to the ground node 112. An emitter of the BJT 312 is coupled to the node 324. Each of a base and a collector of the BJT 312 is coupled to the ground node 112. Thus, the BJT 312 is a diode-connected BJT having an anode coupled to the node 324 and a cathode coupled to the ground node 112. The BJT 314 has N times the emitter area as the BJT 312, where N is an integer greater than one.

In operation, the operational amplifier 308 is self-biasing and sets the control voltage $V_P$ to turn on the FETs 302 and 304. The operational amplifier 308 applies negative feedback so that the voltage at the node 324 equals the voltage at the node 326. The voltage at the node 324 is a voltage $V_{EB1}$, which is the voltage between the emitter and base of the BJT 312. The voltage $V_{EB1}$ is complementary to temperature (i.e., has a negative Tempco). The voltage at the emitter of the BJT 314 is $V_{EB2}$, which is the voltage between the emitter and base of the BJT 314. The voltage $V_{EB2}$ is complementary to temperature. The voltage across the resistor 310, between the node 326 and the emitter of the BJT 314, is $\Delta V_{BE}=V_{EB1}-V_{EB2}=V_{BE2}-V_{BE1}$. The differential voltage $\Delta V_{BE}$ can be mathematically expressed as $\Delta V_{BE}=n*V_T*\ln(N)$, where $V_T$ is the thermal temperature, n is the ideality factor, N is the ratio of emitter area between the BJT 314 and the BJT 312, and ln denotes the natural logarithm function. For purposes of example herein, the ideality factor n is assumed to be one and is omitted from subsequent expressions. The thermal voltage $V_T=KT/q$, where T is the temperature in Kelvin, K is the Boltzmann constant, and q is the electron charge in coulombs. As such, $\Delta V_{BE}$ is proportional to temperature (i.e., has a positive Tempco). The current Iptat can be mathematically expressed as Iptat=$\Delta V_{BE}$/R1, which is also proportional to temperature. The voltage $V_P$ at the node 210 controls current sources in the Tempco circuits to mirror the current Iptat.

The operational amplifier 316 applies negative feedback through adjustment of the control voltage $V_C$ to equalize the voltage at node 328 and the voltage at node 324 (e.g., $V_{EB1}$). Thus, the current Ictat (going from the node 330 into the resistor ladder 318) can be mathematically expressed as Ictat=$V_{EB1}$/R2". Since $V_{EB1}$ is complementary to temperature, then Ictat is also complementary to temperature. The voltage $V_C$ at the node 212 controls current sources in the Tempco circuits to mirror the current Ictat. The current Ictat can be trimmed by varying the Flat Trim code. The flat trim balances the temperature coefficient by adjusting Ictat relative to Iptat so that Ictat+Iptat=Iztat is approximately constant over a range of temperature. Note that while the slope of Iptat with respect to temperature is constant, the slope of Ictat with respect to temperature is non-linear. Thus, Iztat varies from the desired constant value over a range of temperature. This first-order error is corrected, as described further below.

Figure 5A:
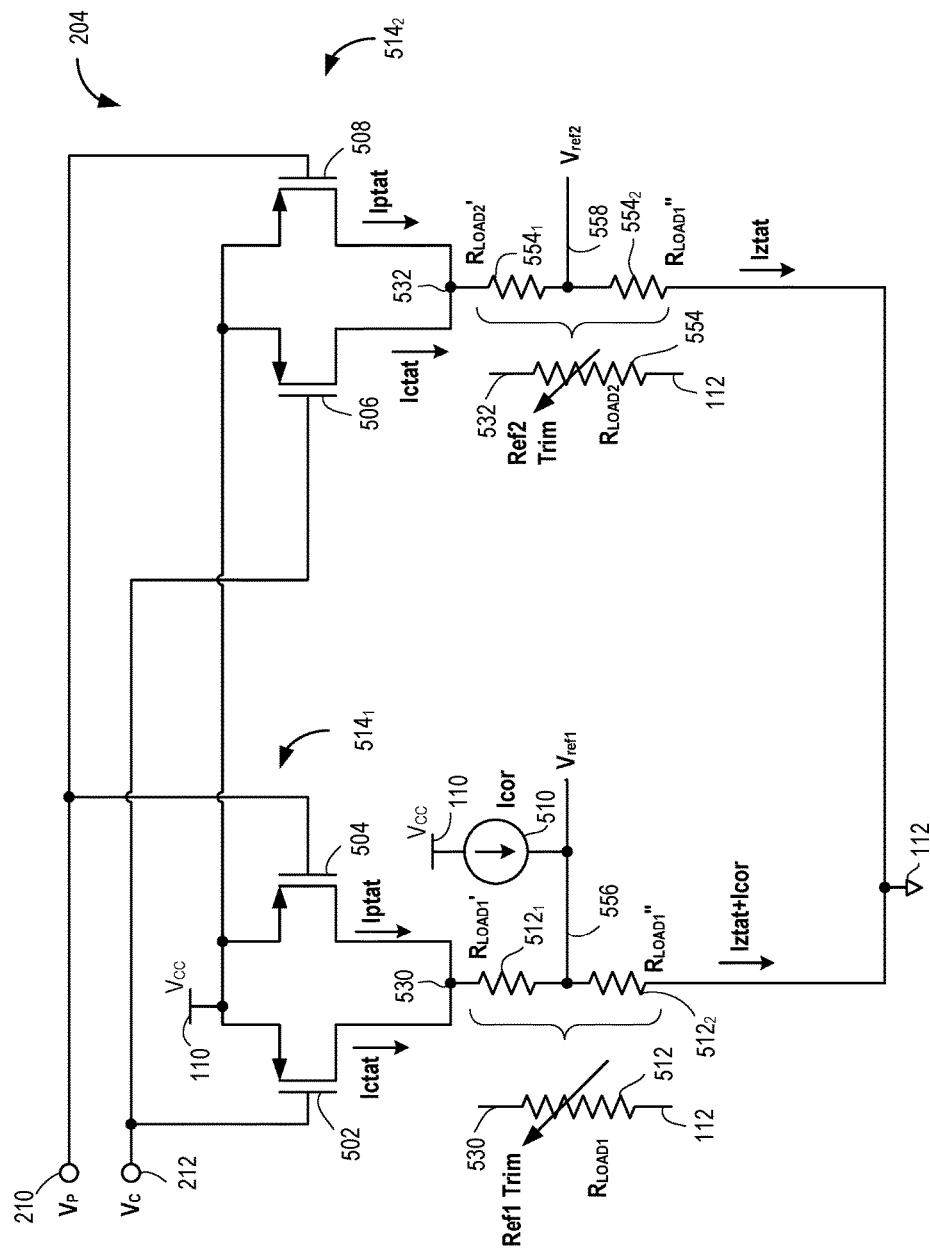
FIG. 5A is a schematic diagram depicting a zero temperature coefficient (Tempco) circuit according to an example.

FIG. 5A is a schematic diagram depicting the zero Tempco circuit 204 according to an example. The zero Tempco circuit 204 includes p-channel FETs 502, 504, 506, and 508 (e.g., p-type MOSFETs). The zero Tempco circuit 204 further includes a curvature correction circuit 510, a resistor ladder 512, and a resistor ladder 554.

A source of the FET 502 is coupled to the node 110 that supplies $V_{CC}$. A drain of the FET 502 is coupled to a node 530. A gate of the FET 502 is coupled to the node 212 that supplies the control voltage $V_C$. A source of the FET 504 is coupled to the node 110 that supplies $V_{CC}$. A drain of the FET 504 is coupled to a node 530. A gate of the FET 504 is coupled to the node 210 that supplies the control voltage $V_P$. A source of the FET 506 is coupled to the node 110. A drain of the FET 506 is coupled to a node 532. A gate of the FET 506 is coupled to the node 212 that supplies the control voltage $V_C$. A source of the FET 508 is coupled to the node 110 that supplies $V_{CC}$. A drain of the FET 508 is coupled to the node 532. A gate of the FET 508 is coupled to the node 210 that supplies the control voltage $V_P$. The FETs 502 and 504 form a current source $514_1$ that mirrors Ictat and Iptat. The FETs 506 and 508 form a current source $514_2$ that mirrors Ictat and Iptat.

The resistor ladder 512, having a resistance $R_{LOAD1}$, is coupled between the node 530 and the ground node 112. A node 556 is coupled to a selected tap of the resistor ladder 512 based on the value of the Ref1 Trim code. Selection of the tap results in a resistance $512_1$ coupled between the node 530 an the node 556, and a resistance $512_2$ coupled between the node 556 and the ground node 112. The resistance $512_1$ has a value $R_{LOAD1}'$, and the resistance $512_2$ has a value $R_{LOAD1}''$. The curvature correction circuit 510 is coupled to the node 556 to supply a current Icor, as described further below.

The resistor ladder 554, having a resistance $R_{LOAD2}$, is coupled between the node 532 and the ground node 112. A node 558 is coupled to a selected tap of the resistor ladder 554 based on the value of the Ref2 Trim code. Selection of the tap results in a resistance $554_1$ coupled between the node 532 and the node 558, and a resistance $554_2$ coupled between the node 558 and the ground node 112. The resistance $554_1$ has a value $R_{LOAD2}'$, and the resistance $554_2$ has a value $R_{LOAD2}''$.

In operation, the control voltage $V_C$ controls the FETs 502 and 506 to supply the current Ictat. The control voltage $V_P$ controls the FETs 504 and 508 to supply the current Iptat. The currents Ictat and Iptat feed the node 530. The control circuit 114 sets the Ref1 Trim to control values of $R_{LOAD1}'$ and $R_{LOAD1}''$. The curvature correction circuit 510 supplies a current Icor to the resistor ladder 512 such that, in steady state condition, the sum of the currents Iztat and Icor conducts through the resistance $R_{LOAD1}''$.

The node 556 supplies a voltage that is proportional to Iztat+Icor, which is referred to as $V_{ref1}$. The voltage $V_{ref1}$ has a zero Tempco.

The currents Ictat and Iptat feed the node 532. In steady state condition, the current Iztat conducts through the resistor ladder 554. The control circuit 114 controls sets Ref2 Trim to control values for $R_{LOAD2}'$ and $R_{LOAD2}''$. The node 558 supplies a voltage, $V_{ref2}$, which is proportional to Iztat. The voltage $V_{ref2}$ has a zero Tempco.

The Ref1 Trim and Ref2 Trim codes set a direct current (DC) level of the corresponding pre-gain voltages at the nodes 556 and 558, respectively. Gain circuits can be used to amplifier or attenuate the pre-gain voltages. Voltage dividers can then provide one or more fractions of the post-gain reference voltage.

In the example, the zero Tempco circuit 204 includes two current sources 514 for mirroring Ictat and Iptat to generate three zero Tempco voltages. In other examples, the zero Tempco circuit 204 can include less or more than two current sources 514 for generating any number of zero Tempco voltages.

Figure 5B:
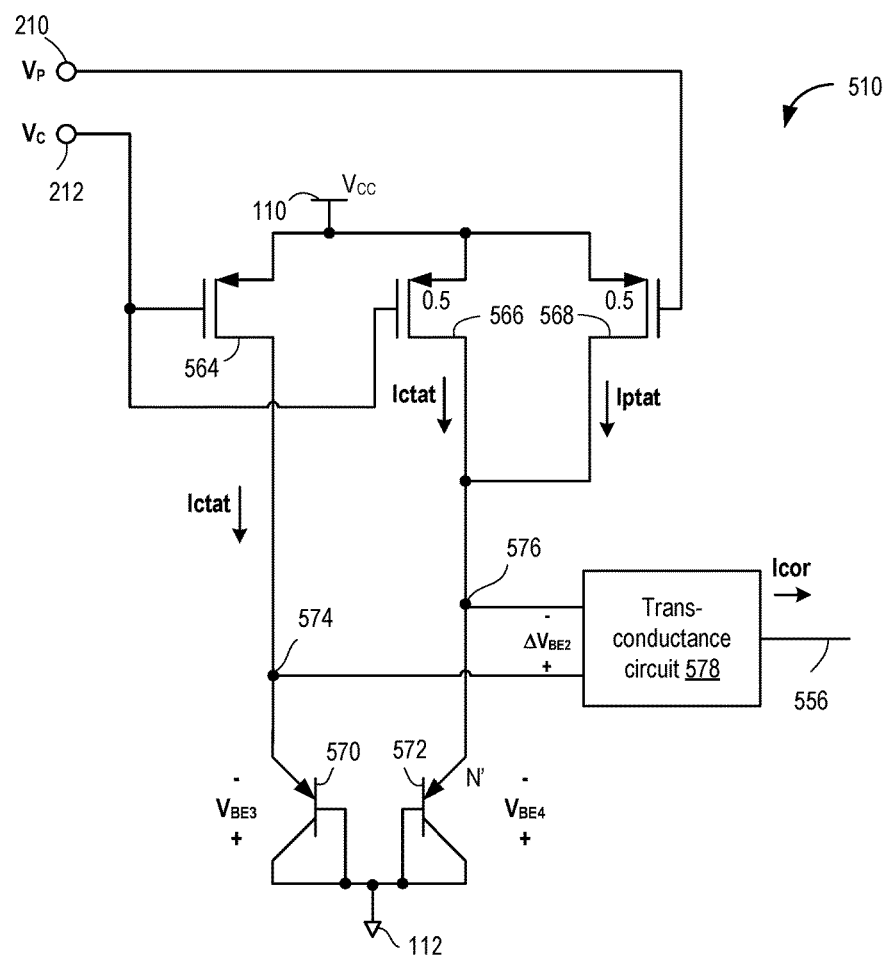
FIG. 5B is a schematic diagram depicting a curvature correction circuit according to an example.

FIG. 5B is a schematic diagram depicting the curvature correction circuit 510 according to an example. The curvature correction circuit 510 includes p-channel FETs 564, 566, and 568 (e.g., p-type MOSFETs). The curvature correction circuit 510 further includes PNP BJTs 570 and 572, as well as a trans-conductance circuit 578.

Sources of the FETs 564, 566, and 568 are coupled to the node 110 that supplies $V_{CC}$. A drain of the FET 564 is coupled to the node 574, and a gate of the FET 564 is coupled to the node 212 that supplies the control voltage $V_C$. Drains of the FETs 566 and 568 are coupled to the node 5576. A gate of the FET 566 is coupled to the node 212 that supplies the control voltage $V_C$. A gate of the FET 568 is coupled to the node 210 that supplies the control voltage $V_P$. The width of the FETs 566 and 568 are half that of the FET 564. The FET 564 supplies a mirror of the current Ictat, the FET 566 supplies a mirror of the current Ictat/2, and the FET 568 supplies a mirror of the current Iptat/2.

An emitter of the BJT 570 is coupled to the node 574 to provide the voltage $V_{EB3}$. An emitter of the BJT 572 is coupled to the node 576 to provide the voltage $V_{EB4}$. Bases and collectors of the BJTs 570 and 572 are coupled to the ground node 112. Thus, the BJTs 570 and 572 are diode-connected BJTs coupled between the node 574 and the ground node 112, and between the node 576 and the ground node 112, respectively. The BJT 572 has N' times the emitter area as the BJT 570, where N' is an integer greater than one.

Inputs of the trans-conductance circuit 578 are coupled to the nodes 574 and 576. An output of the trans-conductance circuit 578 is coupled to the node 556 and supplies the current Icor.

Figure 6:
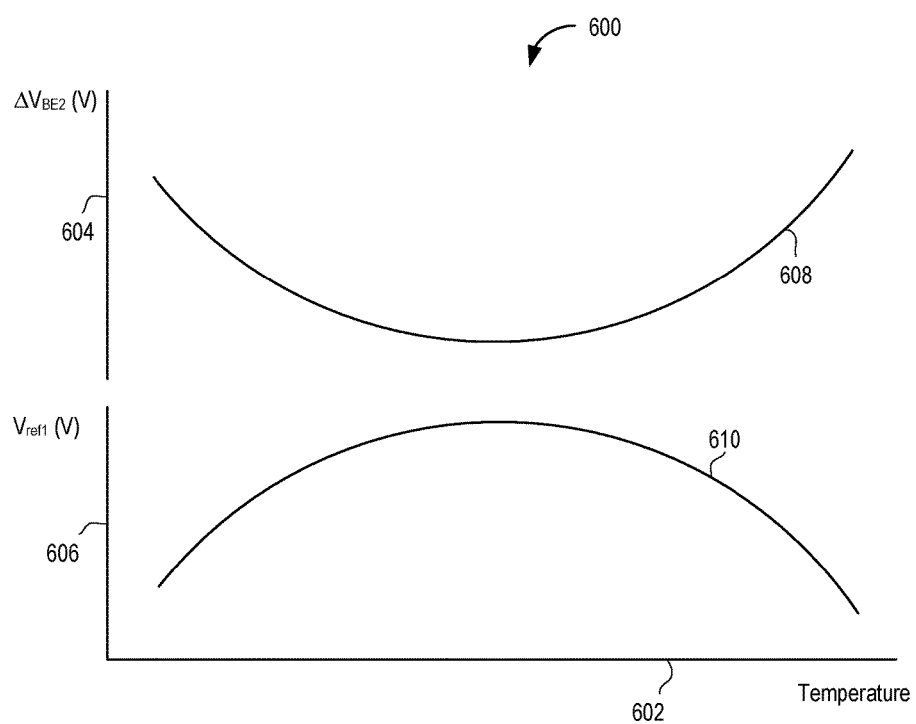
FIG. 6 is a graph illustrating the dependence of reference voltage on temperature.

In operation, the current Ictat varies non-linearly with temperature. That is, the derivative of Ictat with respect to temperature is not constant. As such, any voltage generated from Iztat will vary over temperature. FIG. 6 is a graph 600 illustrating the dependence of $V_{ref1}$ on temperature. The graph 600 includes an axis 602 representing temperature, and an axis 606 representing the voltage $V_{ref1}$ in volts. As shown by a curve 610, the voltage $V_{ref1}$ has a convex bow with respect to temperature. That is, $V_{ref1}$ increases with increasing temperature until reaching a maximum value and then decreases with further increases in temperature.

Returning to FIG. 5B, the curvature correction circuit 510 applies second-order correction to Iztat to mitigate the temperature dependence of $V_{ref1}$ due to first-order error in Ictat. In particular, the differential voltage $\Delta V_{BE2}=V_{BE4}-V_{BE3}=V_T*\ln((N'*Iztat/2)/I_{S4})-V_T*\ln(Ictat/I_{S3})$, where $I_{S4}$ and $I_{S3}$ are the reverse saturation currents of the BJTs 570 and 572, respectively. If the reverse saturation currents are approximately equal, the expression reduces to $\Delta V_{BE2}=V_T*(\ln(N'*Iztat/2)-\ln(Ictat))$. The graph 600 in FIG. 6 includes an axis 604 representing $\Delta V_{BE2}$ in volts. As shown by a curve 608, the voltage $\Delta V_{BE2}$ has a concave bow with respect to temperature. That is, $\Delta V_{BE2}$ decreases with increasing temperature until reaching a minimum value and then increases with further increases in temperature. The trans-conductance circuit 578 converts the differential voltage $\Delta V_{BE2}$ into the current Icor, which has the same concave curvature over temperature. The trans-conductance circuit 578 injects the current Icor into the node 556. As temperature varies, the current Ictat+Icor is substantially constant due to the second-order curvature correction.

Figure 5C:
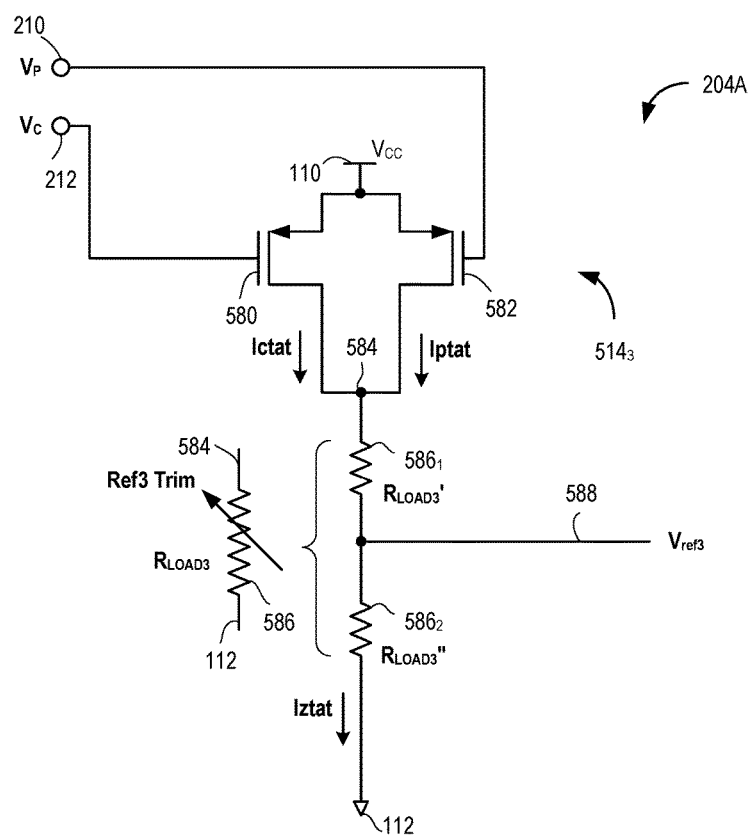
FIG. 5C is a schematic diagram depicting another portion of the zero Tempco circuit of FIG. 5A according to an example.

FIG. 5C is a schematic diagram depicting another portion 204A of the zero Tempco circuit 204 according to an example. The portion 204A of the zero Tempco circuit 204 includes p-channel FETs 580 and 582, as well as a resistor ladder 586. A source of the FET 580 is coupled to the node 110 that supplies $V_{CC}$. A drain of the FET 580 is coupled to a node 584. A gate of the FET 580 is coupled to the node 212 that supplies the control voltage $V_C$. A source of the FET 582 is coupled to the node 110 that supplies $V_{CC}$. A drain of the FET 582 is coupled to the node 584. A gate of the FET 582 is coupled to the node 210 that supplies the control voltage $V_P$. The FETs 580 and 582 form a current source $514_3$ that mirrors Ictat and Iptat.

The resistor ladder 586, having a resistance $R_{LOAD3}$, is coupled between the node 584 and the ground node 112. A node 588 is coupled to a selected tap of the resistor ladder 586 based on the value of the Ref3 Trim code. Selection of the tap results in a resistance $586_1$ coupled between the node 584 and the node 588, and a resistance $586_2$ coupled between the node 588 and the ground node 112. The resistance $586_1$ has a value $R_{LOAD3}'$, and the resistance $586_2$ has a value $R_{LOAD3}''$. The node 588 supplies a voltage Vref3 that is a pre-gain zero Tempco voltage.

Figure 7:
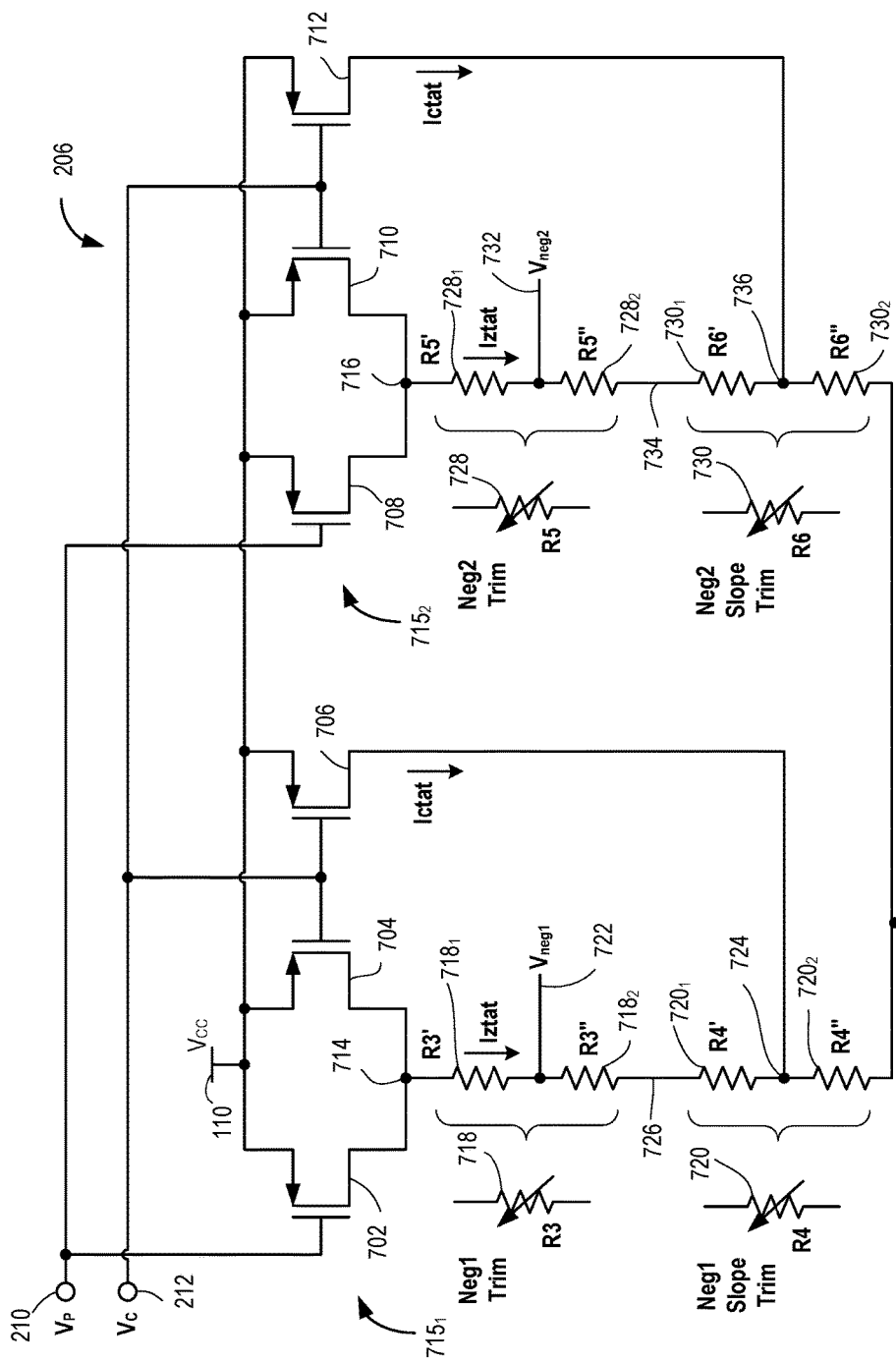
FIG. 7 is a schematic diagram depicting a negative Tempco circuit according to an example.

FIG. 7 is a schematic diagram depicting the negative Tempco circuit 206 according to an example. The negative Tempco circuit 206 includes six p-channel FETs 702 . . . 712 and resistor ladders 718, 720, 728, and 730. Sources of the FETs 702 . . . 712 are coupled to the node 110 that supplies $V_{CC}$. Drains of the FETs 702 and 704 are coupled to a node 714. A drain of the FET 706 is coupled to a node 724. Drains of the FETs 708 and 710 are coupled to a node 716. A drain of the FET 712 is coupled to a node 736. Gates of the FETs 702 and 708 are coupled to the node 210 that supplies the control voltage $V_P$. Gates of the FETs 704, 706, 710, and 712 are coupled to the node 212 that supplies the control voltage $V_C$. The FETs 702, 704, and 706 form a first current source $715_1$, and the FETs 708, 710, and 712 form a second current source $715_2$.

The resistor ladder 718, having a resistance R3, is coupled between the node 714 and a node 726. The resistor ladder 720, having a resistance R4, is coupled between the node 726 and the ground node 112. The resistor ladders 718 and 720 are coupled in series between the node 714 and the ground node 112. A selected tap of the resistor ladder 718, as determined by the code Neg1 Trim generated by the control circuit 114, is coupled to a node 722. The resistor ladder 718 is effectively split between a resistance $718_1$ and a resistance $718_2$, where the resistance $718_1$ has a value R3' and the resistance $718_2$ has a value R3". A selected tap of the resistor ladder 720, as determined by the code Neg1 Slope Trim generated by the control circuit 114, is coupled to the node 724. The resistor ladder 720 is effectively split between a resistance $720_1$ and a resistance $720_2$, where the resistance $720_1$ has a value R4' and the resistance $720_2$ has a value R4".

The resistor ladder 728, having a resistance R5, is coupled between the node 716 and a node 734. The resistor ladder 730, having a resistance R6, is coupled between the node 734 and the ground node 112. The resistor ladders 728 and 730 are coupled in series between the node 716 and the ground node 112. A selected tap of the resistor ladder 728, as determined by the code Neg2 Trim generated by the control circuit 114, is coupled to a node 732. The resistor ladder 728 is effectively split between a resistance $728_1$ and a resistance $728_2$, where the resistance $728_1$ has a value R5' and the resistance $728_2$ has a value R5". A selected tap of the resistor ladder 730, as determined by the code Neg2 Slope Trim generated by the control circuit 114, is coupled to the node 736. The resistor ladder 730 is effectively split between a resistance $730_1$ and a resistance $730_2$, where the resistance $730_1$ has a value R6' and the resistance $730_2$ has a value R6".

In operation, the FETs 702 and 704 supply a current Iztat (i.e., Ictat+Iptat) through the series combination of the resistor ladder 718 and the resistor ladder 720. The FET 706 supplies a mirror of Ictat through the resistance $720_2$. The voltage at the node 722 is $V_{neg1}=Iztat*(R3+R4)+Ictat*R4''$. The voltage $V_{neg1}$ has a zero Temoco component Iztat*(R3+R4) and a negative Tempco component Ictat*R4". Thus, the voltage $V_{neg1}$ has a negative Tempco. The control circuit 114 sets the code Neg1 Slope Trim to control the slope of the negative Tempco for the voltage $V_{neg1}$. The control circuit 114 sets the code Neg1 Trim to control the DC level of the voltage $V_{neg1}$ given the code used for Neg1 Slope Trim.

The FETs 708 and 710 supply a current Iztat (i.e., Ictat+Iptat) through the series combination of the resistor ladder 728 and the resistor ladder 730. The FET 712 supplies a mirror of Ictat through the resistance 730₂. The voltage at the node 732 is $V_{neg2}$=Iztat*(R5+R6)+Ictat*R6". The voltage $V_{neg2}$ has a zero Temoco component Iztat*(R5+R6) and a negative Tempco component Ictat*R6". Thus, the voltage $V_{neg2}$ has a negative Tempco. The control circuit 114 sets the code Neg2 Slope Trim to control the slope of the negative Tempco for the voltage $V_{neg2}$. The control circuit 114 sets the code Neg2 Trim to control the DC level of the voltage $V_{neg2}$ given the code used for Neg2 Slope Trim. The voltage $V_{neg2}$ is set independent of the voltage $V_{neg1}$.

Although two current sources 715 and two pairs of resistor ladders are shown, the negative Tempco circuit 206 can include any number of current sources 715, each coupled to a pair of resistor ladders as shown in FIG. 7. In this manner, the negative Tempco circuit can supply any number of complementary-to-temperature voltages. In addition, although gain circuits are omitted from FIG. 7, in some examples, one or both of the pre-gain voltage outputs can be coupled to a gain circuit, similar to the configuration shown in FIG. 5A.

Figure 8:
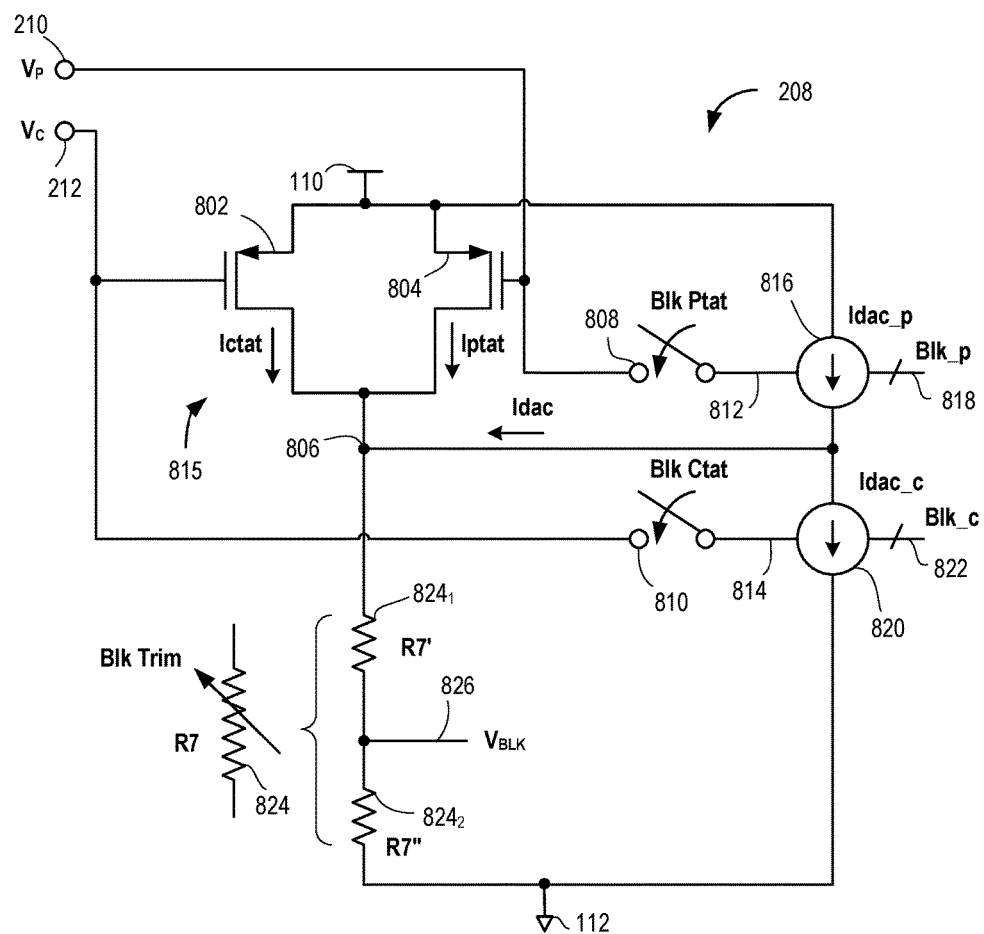
FIG. 8 is a schematic diagram depicting a positive Tempco circuit according to an example.

FIG. 8 is a schematic diagram depicting the positive Tempco circuit 208 according to an example. The positive Tempco circuit 208 includes p-channel FETs 802 and 804, a resistor ladder 824, switches 808 and 810, and digital-to-analog (DAC) current sources 816 and 820. Sources of the FETs 802 and 804 are coupled to the node 110 that supplies the voltage $V_{CC}$. Drains of the FETs 802 and 804 are coupled to a node 806. A gate of the FET 802 is coupled to the node 212 that supplies the control voltage $V_C$. A gate of the FET 804 is coupled to the node 210 that supplies the control voltage $V_P$. The FETs 802 and 804 form a current source 815 that supplies Iztat=Ictat+Iptat.

The resistor ladder 824, having a resistance R7, is coupled between the node 806 and the ground node 112. A selected tap of the resistor ladder 824, as controlled by the Blk Trim code set by the control circuit 114, is coupled to a node 826. The resistor ladder 824 is effectively split into a resistance 824₁ and a resistance 824₂, having values R7' and R7", respectively. The resistance 824₁ is coupled between the node 806 and the node 826. The resistance 824₂ is coupled between the node 826 and the ground node 112. The node 826 supplies a voltage $V_{BLK}$.

One terminal of the switch 808 is coupled to the node 210 that supplies the control voltage $V_P$. Another terminal of the switch 808 is coupled to a node 812. A reference voltage input of the current DAC 816 is coupled to the node 812. The current DAC 816 includes a digital control input coupled to a bus 818 that supplies a digital signal Blk_p. A current output of the current DAC 816 is coupled to the node 806. A supply voltage input of the current DAC 816 is coupled to the node 110 that supplies the voltage $V_{CC}$.

One terminal of the switch 810 is coupled to the node 212 that supplies the control voltage $V_C$. Another terminal of the switch 810 is coupled to a node 814. A reference voltage input of the current DAC 820 is coupled to the node 814. The current DAC 820 includes a digital control input coupled to a bus 822 that supplies a digital signal Blk_c. A current output of the current DAC 820 is coupled to the ground node 112. A supply voltage input of the current DAC 820 is coupled to the node 806.

In operation, the voltage $V_{BLK}$=Iztat*R7"+Idac*R7". The current Idac, which flows into the node 806, depends on the state of the switches 808 and 810. If both switches 808 and 810 are open, the current Idac is zero. If the switch 808 is closed and the switch 810 is open, the current DAC 816 receives the voltage $V_P$. The current DAC 816 provides a ratio of the current Iptat based on the code supplied by the digital signal Blk_p. The current DAC 816 outputs a current Idac_p. The current Idac equals the current Idac_p supplied by the current DAC 816. In such case, the voltage $V_{BLK}$ includes a zero Tempco component Iztat*R7" and a positive Tempco component Idac_p*R7".

If the switch 810 is closed and the switch 808 is open, the current DAC 820 receives the voltage $V_C$. The current DAC 820 sinks a ratio of the current Ictat based on the code supplied by the digital signal Blk_C. The current DAC 820 sinks a current Idac_c. The current Idac equals the -Idac_c supplied by the current DAC 820. In such case, the voltage $V_{BLK}$ includes a zero Tempco component Iztat*R7" and a positive Tempco component -Idac_c*R7".

If both switches 808 and 810 are closed, the current Idac=Idac_p–Idac_c. In such case, the voltage $V_{BLK}$ includes a zero Tempco component Iztat*R7" and a positive Tempco component (Idac_p-Idac_c)*R7".

In some examples, the control circuit 114 generates control signals Blk Ptat and Blk Ctat to open and close the switches 808 and 810 in an alternating sequence. The control circuit 114 controls the magnitude of the oscillation using the digital signals Blk_p and Blk_c. The control circuit 114 controls the DC level of the voltage $V_{BLK}$ using the Blk Trim code. While a single current source 815 and load (resistor ladder 824 and current DACs 816, 820) are shown, it is to be understood that the positive Tempco circuit 208 can include more than one current source 815 and associated load to generate more than one positive Tempco voltage. In some examples, the pre-gain voltage $V_{BLK}$ can be coupled to a gain circuit to provide a positive Tempco voltage with gain.

Figure 9:
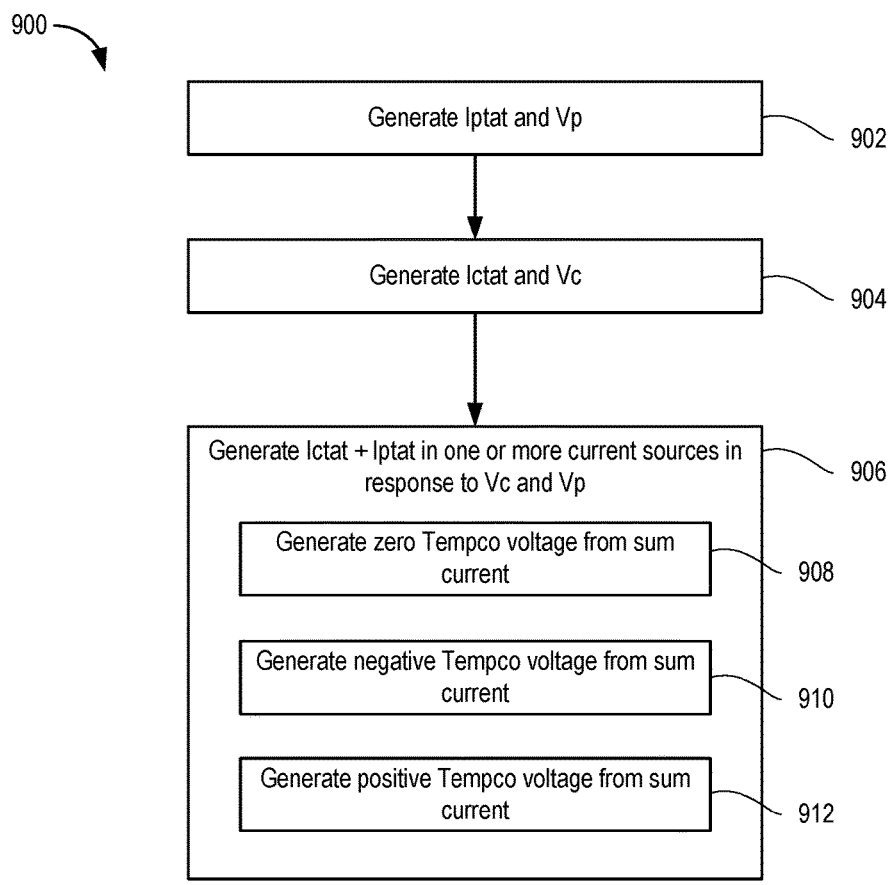
FIG. 9 is a flow diagram depicting a method of generating a voltage reference according to an example.

FIG. 9 is a flow diagram depicting a method 900 of generating a voltage reference according to an example. The method 900 begins at block 902, where the reference circuit 202 generates Iptat and the control voltage Vp. At block 904, the reference circuit 202 generates Ictat and the control voltage Vc. At block 906, one or more current sources generate a sum current of Iptat and Ictat in response to the control voltages Vp and Vc. For example, at block 908, the zero Tempco circuit 204 generates a zero Tempco voltage from the sum current. At block 910, the negative Tempco circuit 206 generates a negative Tempco voltage from the sum current. At block 912, the positive Tempco circuit 208 generates a positive Tempco voltage from the sum current.

Figure 10:
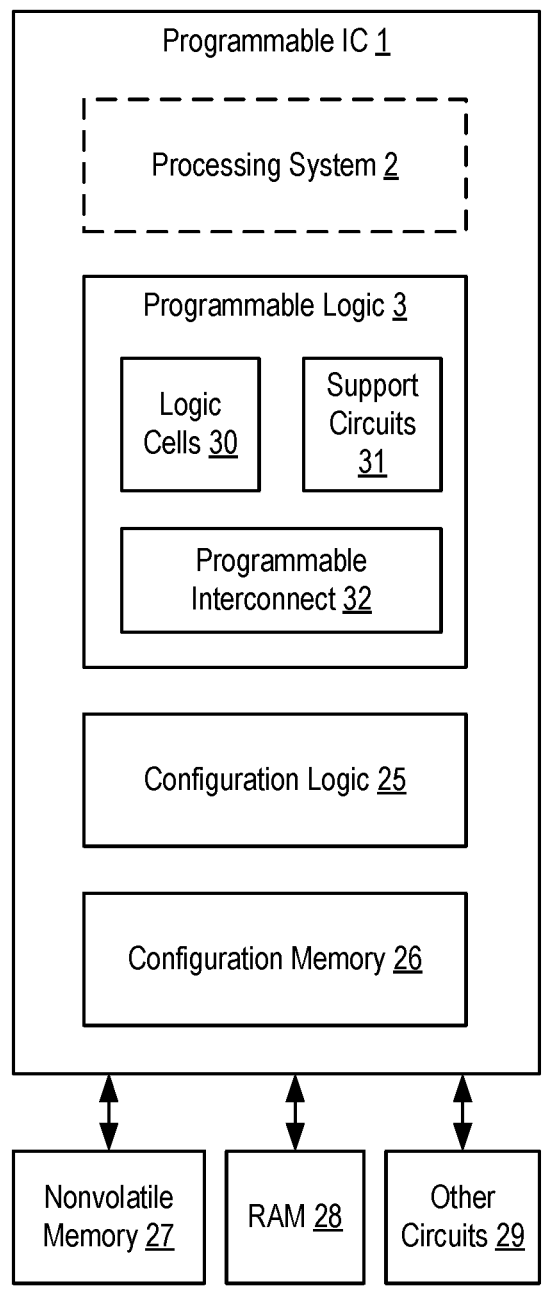
FIG. 10 is a block diagram depicting a programmable IC in which the voltage reference circuit described herein can be used according to an example.

FIG. 10 is a block diagram depicting a programmable IC 1 according to an example in which the voltage reference circuit 200 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 11:
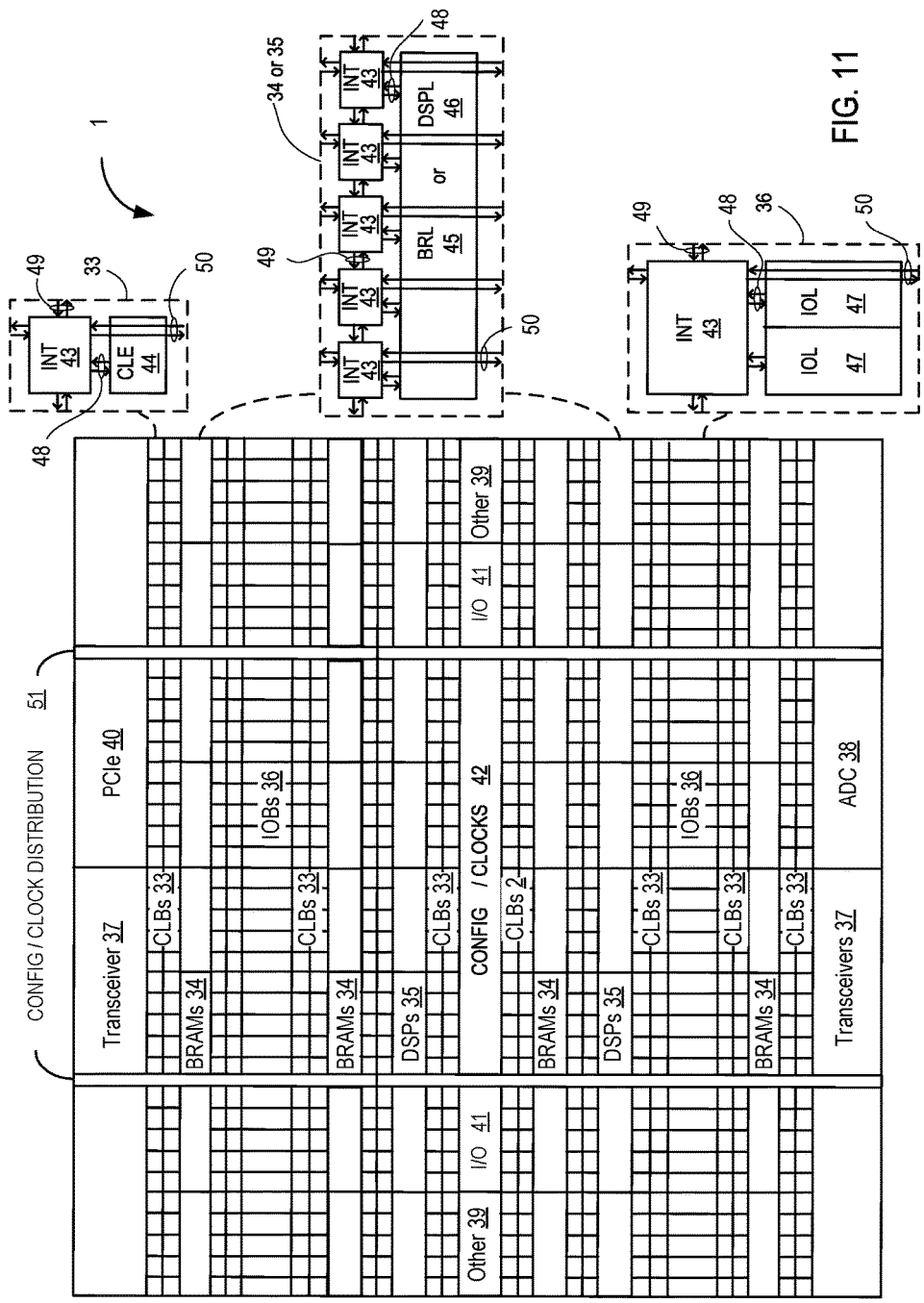
FIG. 11 illustrates a field programmable gate array (FPGA) implementation of the programmable IC of FIG. 10.

FIG. 11 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 11. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 11) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic.

Note that FIG. 11 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A voltage reference circuit, comprising:
a reference circuit comprising a first circuit configured to generate a proportional-to-temperature current and corresponding first control voltage and a second circuit configured to generate a complementary-to-temperature current and corresponding second control voltage;
a first current source coupled to a first load circuit, the first current source generating a first sum current equivalent to a sum of the proportional-to-temperature current and the complementary-to-temperature current in response to the first and second control voltages, the first load circuit generating a zero temperature coefficient (Tempco) voltage from the first sum current; and
a second current source coupled to a second load circuit, the second current source generating a second sum current equivalent to a sum of the proportional-to-temperature current and the complementary-to-temperature current in response to the first and second control voltages, the second load circuit generating a negative Tempco voltage from the second sum current and an equivalent of the complementary-to-temperature current.

2. The voltage reference circuit of claim 1, further comprising:
a third current source coupled to a third load circuit, the third current source generating a third sum current equivalent to a sum of the proportional-to-temperature current and the complementary-to-temperature current in response to the first and second control voltages, the third load circuit generating a positive Tempco voltage from the third sum current and at least one equivalent of the complementary-to-temperature current and the proportional-to-temperature current.

3. The voltage reference circuit of claim 2, wherein the third current source comprises a first field effect transistor (FET) and a second FET having a first common source and a first common drain, a gate of the first FET coupled to receive the first control voltage and a gate of the second FET coupled to receive the second control voltage.

4. The voltage reference circuit of claim 3, wherein the third load circuit comprises:

a first current digital-to-analog converter (DAC), switchably coupled to receive the first control voltage, and configured to supply a first positive temperature coefficient (Tempco) current;
a second current DAC, switchably coupled to receive the second control voltage, and configured to supply a second positive Tempco current; and
a resistor ladder coupled between the first common drain and a ground node, the resistor ladder converting the third sum current plus one or both of the equivalents of the first positive Tempco current and the second positive Tempco current into the positive Tempco voltage.

5. The voltage reference circuit of claim 1, wherein the first current source comprises a first field effect transistor (FET) and a second FET having a first common source and a first common drain, a gate of the first FET coupled to receive the first control voltage and a gate of the second FET coupled to receive the second control voltage, and wherein the first load circuit comprises a resistor ladder coupled between the first common drain and a ground node, the resistor ladder converting the first sum current into the zero Tempco voltage.

6. The voltage reference circuit of claim 5, further comprising:
a curvature compensation circuit configured to inject a correction current into the resistor ladder to combine with the first sum current, the curvature compensation circuit comprising:
a third FET and a fourth FET having a second common source and a second common drain, a gate of the third FET coupled to receive the first control voltage and a gate of the third FET coupled to receive the second control voltage;
a fifth FET having a gate coupled to receive the second control voltage;
a first diode-connected bipolar junction transistor (BJT) coupled between a drain of the fifth FET and the ground node;
a second diode-connected bipolar junction transistor (BJT) coupled between the second common drain and the ground node; and
a trans-conductance circuit configured to convert a voltage between the drain of the fifth FET and the second common drain to the correction current.

7. The voltage reference circuit of claim 1, wherein the second current source comprises:
a first field effect transistor (FET) and a second FET having a first common source and a first common drain, a gate of the first FET coupled to receive the first control voltage and a gate of the second FET coupled to receive the second control voltage; and
a third FET having a gate coupled to the second control voltage; and
wherein the second load circuit comprises:
a first resistor ladder and a second resistor ladder coupled in series between the first common drain and a ground node, the first and second resistor ladders receiving the second sum current from the first common drain, a portion of the second resistor ladder receiving an equivalent of the complementary-to-temperature current from a drain of the third FET.

8. The voltage reference circuit of claim 1, wherein the reference circuit comprises:
a first field effect transistor (FET) and a second FET having a first common source and a first common gate;
a first diode-connected bipolar junction transistor (BJT) coupled between a drain of the first FET and a ground node;
a first resistor and a second diode-connected BJT coupled in series between a drain of the second FET and the ground node;
a first operational amplifier having a non-inverting input coupled to the drain of the second FET, an inverting input coupled to the drain of the first FET, and an output coupled to the first common gate;
a third FET having a source coupled to the common source;
a resistor ladder coupled between a drain of the third FET and the ground node; and
a second operational amplifier having an inverting input coupled to the drain of the first FET, a non-inverting input coupled to the resistor ladder, and an output coupled to a gate of the third FET.

9. An integrated circuit, comprising:
one or more circuits; and
a voltage reference circuit that supplies at least one voltage to the one or more circuits, the voltage reference circuit comprising:
a reference circuit comprising a first circuit configured to generate a proportional-to-temperature current and corresponding first control voltage and a second circuit configured to generate a complementary-to-temperature current and corresponding second control voltage;
a first current source coupled to a first load circuit, the first current source generating a first sum current equivalent to a sum of the proportional-to-temperature current and the complementary-to-temperature current in response to the first and second control voltages, the first load circuit generating a zero temperature coefficient (Tempco) voltage from the first sum current; and
a second current source coupled to a second load circuit, the second current source generating a second sum current equivalent to a sum of the proportional-to-temperature current and the complementary-to-temperature current in response to the first and second control voltages, the second load circuit generating a negative Tempco voltage from the second sum current and an equivalent of the complementary-to-temperature current.

10. The integrated circuit of claim 9, wherein the voltage reference circuit further comprises:
a third current source coupled to a third load circuit, the third current source generating a third sum current equivalent to a sum of the proportional-to-temperature current and the complementary-to-temperature current in response to the first and second control voltages, the third load circuit generating a positive Tempco voltage from the third sum current and at least one of equivalent of the complementary-to-temperature current and the proportional-to-temperature current.

11. The IC of claim 10, wherein the third current source comprises a first field effect transistor (FET) and a second FET having a first common source and a first common drain, a gate of the first FET coupled to receive the first control voltage and a gate of the second FET coupled to receive the second control voltage.

12. The IC of claim 11, wherein the third load circuit comprises:
a first current digital-to-analog converter (DAC), switchably coupled to receive the first control voltage, and configured to supply a first positive temperature coefficient (Tempco) current;

a second current DAC, switchably coupled to receive the second control voltage, and configured to supply a second positive Tempco current; and a resistor ladder coupled between the first common drain and a ground node, the resistor ladder converting the third sum current plus one or both of the equivalents of the first positive Tempco current and the second positive Tempco current into the positive Tempco voltage.

13. The IC of claim 9, wherein the first current source comprises a first field effect transistor (FET) and a second FET having a first common source and a first common drain, a gate of the first FET coupled to receive the first control voltage and a gate of the second FET coupled to receive the second control voltage, and wherein the first load circuit comprises a resistor ladder coupled between the first common drain and a ground node, the resistor ladder converting the first sum current into the zero Tempco voltage.

14. The IC of claim 13, further comprising:
a curvature compensation circuit configured to inject a correction current into the resistor ladder to combine with the first sum current, the curvature compensation circuit comprising:
a third FET and a fourth FET having a second common source and a second common drain, a gate of the third FET coupled to receive the first control voltage and a gate of the third FET coupled to receive the second control voltage;
a fifth FET having a gate coupled to receive the second control voltage;
a first diode-connected bipolar junction transistor (BJT) coupled between a drain of the fifth FET and the ground node;
a second diode-connected bipolar junction transistor (BJT) coupled between the second common drain and the ground node; and
a trans-conductance circuit configured to convert a voltage between the drain of the fifth FET and the second common drain to the correction current.

15. The IC of claim 9, wherein the second current source comprises:
a first field effect transistor (FET) and a second FET having a first common source and a first common drain, a gate of the first FET coupled to receive the first control voltage and a gate of the second FET coupled to receive the second control voltage; and
a third FET having a gate coupled to the second control voltage; and
wherein the second load circuit comprises:
a first resistor ladder and a second resistor ladder coupled in series between the first common drain and a ground node, the first and second resistor ladders receiving the second sum current from the first common drain, a portion of the second resistor ladder receiving an equivalent of the complementary-to-temperature current from a drain of the third FET.

16. The IC of claim 9, wherein the reference circuit comprises:
a first field effect transistor (FET) and a second FET having a first common source and a first common gate;
a first diode-connected bipolar junction transistor (BJT) coupled between a drain of the first FET and a ground node;
a first resistor and a second diode-connected BJT coupled in series between a drain of the second FET and the ground node;

a first operational amplifier having a non-inverting input coupled to the drain of the second FET, an inverting input coupled to the drain of the first FET, and an output coupled to the first common gate;
a third FET having a source coupled to the common source;
a resistor ladder coupled between a drain of the third FET and the ground node; and
a second operational amplifier having an inverting input coupled to the drain of the first FET, a non-inverting input coupled to the resistor ladder, and an output coupled to a gate of the third FET.

17. A method of generating a voltage reference, comprising:
generating a proportional-to-temperature current and corresponding first control voltage in a first circuit of a reference circuit;
generating a complementary-to-temperature current and corresponding second control voltage in a second circuit of the reference circuit;
generating a first sum current equivalent to a sum of the proportional-to-temperature current and the complementary-to-temperature current in a first current source in response to the first and second control voltages;
generating a zero temperature coefficient (Tempco) voltage from the first sum current in a first load circuit coupled to the first current source;
generating a second sum current equivalent to a sum of the proportional-to-temperature current and the complementary-to-temperature current in a second current source in response to the first and second control voltages; and
generating a negative Tempco voltage from the second sum current and an equivalent of the complementary-to-temperature current in a second load circuit coupled to the second current source.

18. The method of claim 17, further comprising:
generating a third sum current equivalent to a sum of the proportional-to-temperature current and the complementary-to-temperature current in a third current source response to the first and second control voltages; and
generating a positive Tempco voltage from the third sum current and at least one equivalent of the complementary-to-temperature current and the proportional-to-temperature current in a third load circuit coupled to the third current source.

19. The method of claim 18, wherein the step of generating the positive Tempco voltage comprises:
supplying a first positive Tempco current from a first current digital-to-analog converter (DAC) switchably coupled to receive the first control voltage;
supplying a second positive Tempco current from a second current DAC switchably coupled to receive the second control voltage; and
converting the third sum current plus one or both of the first positive Tempco current and the second positive Tempco current into the positive Tempco voltage in a resistor ladder circuit.

20. The method of claim 17, further comprising:
injecting a correction current into the first load circuit to combine with the first sum current.

* * * * *